US006091181A

United States Patent [19]

Yamashita

[11] Patent Number: 6,091,181

[45] Date of Patent: Jul. 18, 2000

[54] PIEZOELECTRIC ACOUSTIC DEVICE

[75] Inventor: Tsuyoshi Yamashita, Toyama Pref., Japan

[73] Assignee: Hokuriku Electric Industry Co., Ltd., Toyama Pref., Japan

[21] Appl. No.: 09/294,729

[22] Filed: Apr. 19, 1999

[30] Foreign Application Priority Data

| | | | |
|---|---|---|---|
| Apr. 22, 1998 | [JP] | Japan | 10-111722 |
| Apr. 22, 1998 | [JP] | Japan | 10-111723 |

[51] Int. Cl.[7] .......... H01L 41/08

[52] U.S. Cl. .......... 310/328; 310/326

[58] Field of Search .......... 310/322, 334, 310/328, 324, 326

[56] References Cited

U.S. PATENT DOCUMENTS

| | | | |
|---|---|---|---|
| 3,970,879 | 7/1976 | Kumon . | |
| 4,122,365 | 10/1978 | Stephens . | |
| 4,183,017 | 1/1980 | Sims . | |
| 4,379,212 | 4/1983 | Martin | 381/159 |
| 4,386,241 | 5/1983 | Maeda | 381/190 |
| 4,430,529 | 2/1984 | Nakagawa et al. | 381/190 |
| 4,434,430 | 2/1984 | Koto | 347/70 |
| 5,371,428 | 12/1994 | Kikuchi et al. | 310/324 |
| 5,514,927 | 5/1996 | Tichy | 310/330 |
| 5,764,131 | 6/1998 | Twining et al. | 340/311.1 |
| 5,784,340 | 7/1998 | Kanai | 367/140 |

FOREIGN PATENT DOCUMENTS

| | | | |
|---|---|---|---|
| 05038612 | 3/1994 | Japan | G10K 9/13 |
| 5-38612 | 3/1994 | Japan . | |
| 06090489 | 10/1995 | Japan | G10K 9/122 |
| 5-90489 | 10/1995 | Japan . | |

*Primary Examiner*—Thomas M. Dougherty
*Assistant Examiner*—Eliza Stefaniw
*Attorney, Agent, or Firm*—Rankin, Hill, Porter & Clark LLP

[57] ABSTRACT

The present invention provides a piezoelectric acoustic device 2 capable of preventing substantial deflection of a first side wall 17 opposite a piezoelectric vibrator 13 due to application of force to an integral cylinder 12 in a direction toward the first side wall 17. According to the invention, a piezoelectric vibrator 13 including a piezoelectric ceramic element is received in a two-part receiving casing 9 formed by fitting a first casing half 10 and a second casing half 11 together. The first casing half 10 includes a first side wall 17 opposite to the piezoelectric vibrator 13 and a first peripheral wall 18 extending from the first side wall 17. A front air chamber 30 is defined between the first side wall 17 and the piezoelectric vibrator 13. A cylinder 12 is integrally formed on the first side wall 17 so as to extend in a direction perpendicular away from the plane of the first side wall 17. The cylinder 12 is offset toward an outer periphery of the first side wall 17 so that a part 32 of the base 31 of the cylinder 12 is aligned with a part of the first peripheral wall 18 of the first casing half. An opening 23 is provided through the first side wall 17 for connecting the front air chamber 30 to a passage 29 defined by the interior of the cylinder 12. The opening 23 is situated such that a center 28 thereof is offset toward a center point 25 of the first side wall 17, and is preferably adjacent to the inner periphery of the cylinder 12. The opening 23 is covered with a damping cloth member 27 joined to an inner surface 26 of the first side wall 17 by means of a solvent which dissolves the synthetic resin from which the front casing half 10 is formed but not the damping cloth member 27.

15 Claims, 3 Drawing Sheets

PIEZOELECTRIC ACOUSTIC DEVICE

BACKGROUND OF THE INVENTION

The present invention relates to a piezoelectric acoustic device, and more particularly to a piezoelectric acoustic device in the form of a piezoelectric speaker, a piezoelectric buzzer, or the like, for use in electronic equipment such as portable telephones or the like.

A number of piezoelectric acoustic devices are known for use in electronic equipment including, for example, the piezoelectric acoustic devices disclosed in Japanese Utility Model Publication No. 879/1984, Japanese Patent Application Laid-Open Publication No. 75578/1994, Japanese Patent Application Laid-Open Publication No. 28167/1995, U.S. Pat. No. 3,970,879, U.S. Pat. No. 4,122,365 and U.S. Pat. No. 4,183,017. Such prior art piezoelectric acoustic devices generally include a piezoelectric vibrator formed from a piezoelectric ceramic element and a receiving casing for receiving the piezoelectric vibrator. A portion of the receiving casing called a side wall is spaced apart from the piezoelectric vibrator to form a front air chamber. The receiving casing of a typical prior art piezoelectric acoustic device generally includes a centrally mounted cylinder disposed opposite the piezoelectric vibrator for communicating the sound generated by the piezoelectric vibrator in the front air chamber through the interior of a housing of an electronic device such as a portable telephone. When such a piezoelectric acoustic device is mounted in the housing of a portable telephone or other type of electronic device, a force or pressure is often exerted against the cylinder in the direction of the front air chamber. Also, when a waterproof or dust-proof cloth member is arranged between the housing and the cylinder, the cloth member exerts force or pressure on the cylinder in the direction of the front air chamber. When the force exerted against the side wall is high, or the mechanical strength of the side wall is low, the side wall may become deflected, resulting in a variation in the volume of the front air chamber, which can lead to variations in the sound produced by such piezoelectric acoustic devices. In order to solve this problem, it has been proposed to increase the thickness of the side wall to increase its mechanical strength. Unfortunately, such an approach results in an increase in the size of the piezoelectric acoustic device which is highly undesired in the art.

BRIEF DESCRIPTION OF THE DRAWINGS

The present invention will be readily appreciated as the same becomes better understood by reference to the following detailed description when considered in connection with the accompanying drawings; wherein.

DETAILED DESCRIPTION OF THE PREFERRED EMBODIMENT

Now, a piezoelectric acoustic device according to the present invention will be described with reference to the accompanying drawings.

Figure 1:
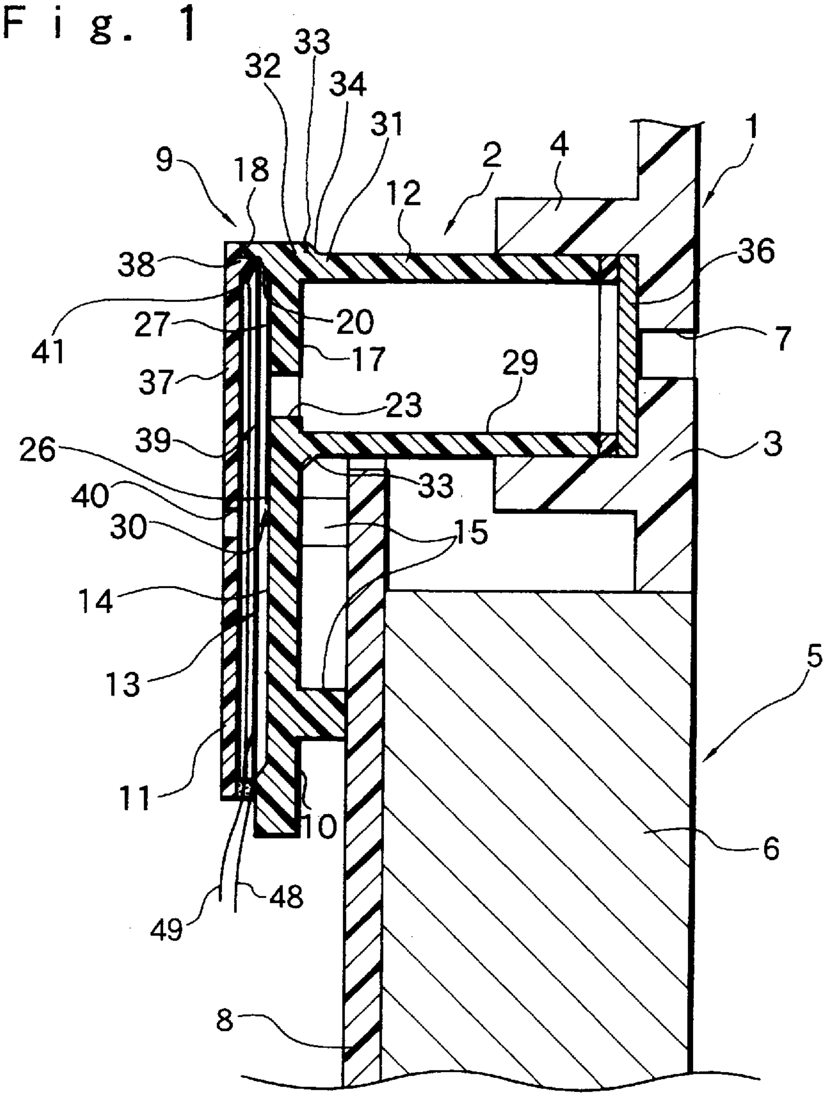
FIG. 1 is a fragmentary schematic sectional view showing a receiver of a portable telephone in which an embodiment of a piezoelectric acoustic device according to the present invention is incorporated.
Figure 2:
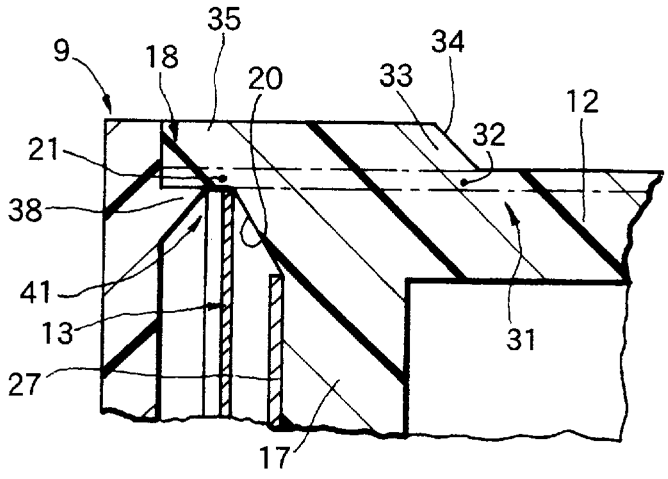
FIG. 2 is an enlarged view of a part of FIG. 1.

Referring first to FIGS. 1 and 2, a receiver of a portable telephone which has an embodiment of a piezoelectric acoustic device according to the present invention incorporated therein is illustrated by way of example.

In FIGS. 1 and 2, a receiver 1 of a portable telephone has a piezoelectric acoustic device 2 of the invention received therein. The receiver 1 includes a housing 3, which is integrally formed on an inner surface thereof with a cylindrical fit section 4 in which a piezoelectric transducer of a cylindrical shape is fittedly mounted. The housing 3 includes an operation surface section 5 on which an electronic component 6 such as a liquid crystal display component or the like is arranged. A sound discharge hole 7 is formed in the housing 3 so as to correspond with the cylindrical fit section 4. The housing 3 is provided with a printed board 8, which has circuits such as a transmit-receive circuit, a liquid crystal drive circuit and the like formed thereon. A piezoelectric acoustic device 2 is mounted to the printed board 8 by means of a fitment (not shown) such as a holder or the like.

Now, the piezoelectric acoustic device 2 of the illustrated embodiment will be described hereinafter with reference to FIGS. 1 to 5.

Figure 3:
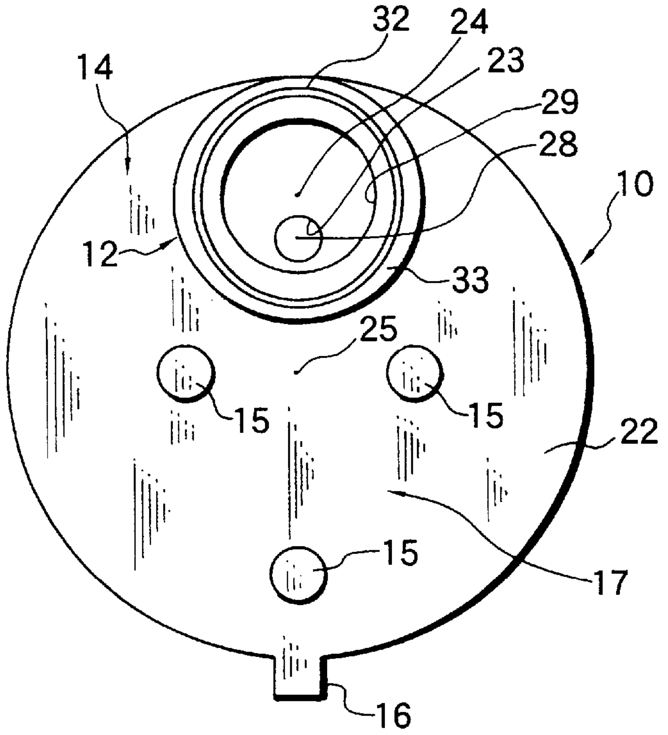
FIG. 3 is a front elevation view showing a first casing half incorporated in the piezoelectric acoustic device of FIG. 1.
Figure 4:
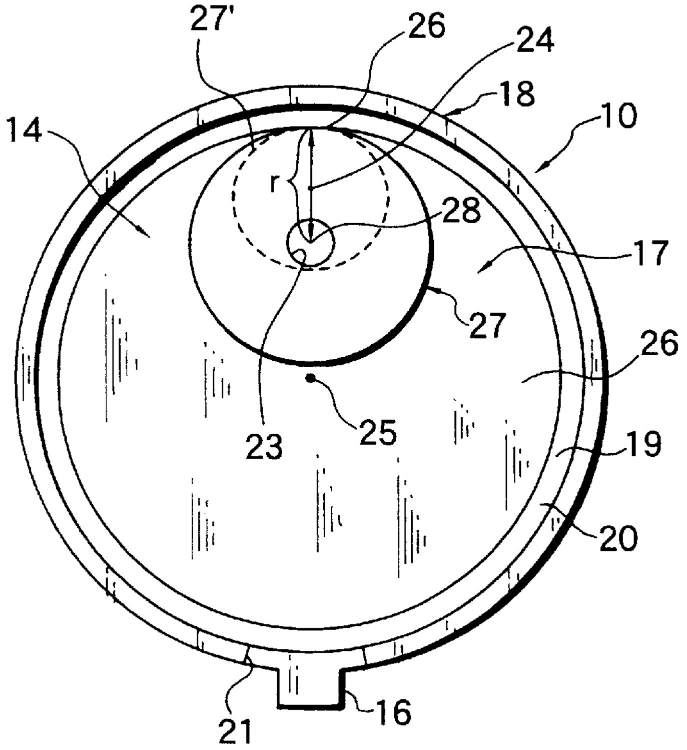
FIG. 4 is a rear view of the first casing half shown in FIG. 3.

The piezoelectric acoustic device 2 includes a two-part receiving casing 9 comprising a combination of a first casing half 10 and a second casing half 11 that are fitted together. The first casing half includes an integrally formed cylinder 12. The two-part receiving casing 9 has a piezoelectric vibrator 13 received therein which is adapted to vibrate depending on an electric signal fed thereto. In the illustrated embodiment, the first casing half 10 and second casing half 11 are fixedly joined to each other by welding or the like which is carried out at a mating portion. The first casing half 10, as shown in FIGS. 3 and 4, includes a casing body 14, which is integrally formed on a front surface thereof with protrusions 15 and on an outer peripheral surface thereof with a projection 16. The first casing half 10 is integrally made of an insulating resin material such as polyphenylene oxide (PPO) containing glass. The casing body 14 includes a first side wall 17 of a disc-like shape having an outer surface 22 and an inner surface 26. A first peripheral wall 18 extends from an outer peripheral portion of the first side wall 17 toward the rear casing half 11. An annular rib 19 is provided on the inner surface 26 of the first side wall 17 at the base of the first peripheral wall 18. The annular rib 19 has an inclined surface 20 which angles from the first peripheral wall 18 toward the inner surface 26 of the first side wall 17. A front air chamber 30 is formed between the inner surface 26 of the first side wall 17 and the piezoelectric vibrator 13. Also, the first peripheral wall 18 includes a cutout 21 corresponding to the projection 16. Three protrusions 15 extend from the outer surface 22 of the first side wall 17 in the same direction as the cylinder 12. The protrusions 15 act as spacers or positioners. An opening 23 is formed in the first side wall 17 to connect the front air chamber 30 with a passage 29 defined by the interior of the cylinder 12. The opening 23 is formed such that a center thereof 28 is offset from a central axis 24 of the cylinder 12 toward a center point 25 of the first side wall 17. A damping cloth member 27 of a circular shape is joined to the inner surface 26 of the first side wall 17. The damping cloth member 27 is air permeable and covers the opening 23. FIG. 4 shows only a contour of the damping cloth member 27 for the sake of clarity.

The damping cloth member 27 is preferably made of a woven fabric of polyester and formed into dimensions of about 6 mm in diameter and about 0.08 mm in thickness.

The damping cloth member 27 is joined onto the inner surface 26 of the first side wall 17 by means of a solvent. Now, the joining will be described. In the preferred embodiment, toluene, which does not dissolve the damping cloth member (polyester) 27 but which dissolves the synthetic resin material (PPO) from which the first casing half 10 is formed, may be used as the solvent. First, as shown in FIG. 4, the damping cloth member 27 is positioned on the inner surface 26 of the first side wall 17 so that an edge of the damping cloth member 27 is abutted against the annular rib 19 in a manner so as to place the center of the damping cloth member 27 as near as possible to the center 28 of the opening 23. Then, a cotton swab impregnated with the solvent is downwardly contacted with the damping cloth member 27 to permeate the solvent into the damping cloth member 27. This results in the inner surface 26 of the first side wall 17 being dissolved by the solvent, so that the dissolved synthetic resin (PPO) may be used to adhere the damping cloth member 27 to the inner surface 26 of the first side wall 17. The damping cloth member 27 is then left to stand at a room temperature to allow the solvent to be volatilized, so that the dissolved synthetic resin adhered to the damping cloth member 27 may be cured, resulting in the damping cloth member 27 being joined to the inner surface 26 of the first side wall 17. In the illustrated embodiment, the opening 23 is arranged such that the center 28 thereof is offset from the central axis 24 of the cylinder 12 toward the center point 25 of the first side wall 17. Such arrangement of the opening 23 substantially prevents the dissolved synthetic resin from entering the opening 23. The synthetic resin material for the first casing half 10 is preferably readily dissolved by a volatile solvent and rapidly re-cured upon volatilization of the solvent. Use of such synthetic resin permits the solvent to be rapidly volatilized from the dissolved synthetic resin, resulting in joining between the damping cloth member 27 and the inner surface 26 of the first side wall 17 being accomplished in a short period of time.

The opening 23, cylinder 12 and first side wall 17 are preferably arranged relative to each other such that a line passing through a plane defined by the first side wall 17 would pass substantially through the center 28 of the opening 23, the central axis 24 of the cylinder 12, and the center point 25 of the first side wall 17. Also, as noted from FIG. 3, the piezoelectric acoustic device of the illustrated embodiment is constructed in such a manner that a small gap is defined between the opening 23 and the inner surface of the cylinder 12. However, in order to maximize a diameter of the damping cloth member 27 or a radius r thereof, the opening 23 should more preferably be formed in the first side wall 17 such that a line passing through a plane defined by the first side wall 17 would pass substantially through the center 28 of the opening 23, the central axis 24 of the cylinder 12, and the center point 25 of the first side wall 17, and there would be no gap between the opening 23 and the inner surface of the cylinder 12 . For illustrative purposes, in FIG. 4, a contour of a damping cloth member 27' is shown (using broken lines) that may be used when the central axis 24 of the cylinder 12 and the center 28 of the opening 23 are coincident. Comparison between the damping cloth members 27 and 27' indicates that the preferred embodiment permits the size of the damping cloth member 27 to be increased to the utmost. Supposing that the piezoelectric vibrator 13 has a diameter of 15 mm, the diameter of the damping cloth member 27' which may be used when the center 28 of the opening 23 and the central axis 24 of the cylinder 12 are coincident is about 3.5 mm. However, in the preferred embodiment, when the opening 23 is arranged so as to be in contact with the inner surface of the cylinder, the diameter of the damping cloth member 27 is about 6 mm. An increase in diameter or radius of the damping cloth member 27 causes migration of the above-described solvent toward an outer peripheral portion of the damping cloth member 27 to be increased. Thus, the damping cloth member 27 should be formed into a size which substantially prevents the synthetic resin dissolved by the solvent from entering the opening 23. Ideally, the damping cloth member 27 is formed into a size which encourages the solvent to migrate toward the outer peripheral region of the damping cloth member 27. This permits the dissolved synthetic resin to be forced toward the outer peripheral portion of the damping cloth member 27 by an osmotic pressure of the solvent, resulting in preventing the dissolved synthetic resin from entering the opening 23.

The cylinder 12 is made integrally with the first side wall 17 of the first casing half 10 and extends in a direction perpendicular to the plane of the first side wall 17.

The cylinder 12 defines a passage 29, which is connected to the front air chamber 30 formed between the piezoelectric vibrator 13 and the first side wall 17 through the opening 23. Also, the cylinder 12, as shown in greater detail in FIG. 2, is disposed toward the outer periphery of the first side wall 17 in such a manner so as to align a part 32 of a base 31 of the cylinder 12 with a part 35 of the first peripheral wall 18. The outer periphery of the base 31 of the cylinder 12 is provided with an annular reinforcing rib 33. The annular reinforcing rib 33 has an inclined surface 34 formed so as to gradually radially expand from the outer surface of the cylinder 12 toward the outer surface 22 of the first side wall 17. The annular reinforcing rib 33 is disposed in such a manner so as to align with a part 35 of the first peripheral wall 18. In the illustrated embodiment, the portion of the part 32 of the base 31 of the cylinder 12 or the part of the annular reinforcing rib 33 overlapping (i.e., being in alignment with) the first peripheral wall 18 is within a range of between 20 degrees and 25 degrees of an arc drawn from the center 25 of the first side wall 17. Such arrangement of the cylinder 12 causes a portion of any pressure or force which may be exerted against the cylinder 12 when the cylinder 12 is fitted into a housing 3 of a receiver 1 to be shared by the first peripheral wall 18. Also, the annular reinforcing rib 33 disperses the force applied to the cylinder 12 over a greater area of the first side wall 17. This results in the first side wall 17 being increased in area receiving the force. This configuration reduces the force applied to the first side wall 17 per unit area, which reduces the tendency of the first side wall 17 to deflect or warp toward the piezoelectric vibrator 13. Such construction effectively keeps the first side wall 17 from being substantially deformed after the piezoelectric acoustic device 2 is incorporated into the housing 3, resulting in the minimization of variations in the sound characteristics of piezoelectric acoustic devices. When the first side wall 17 of a piezoelectric acoustic device 2 is deflected or warped so as to push the damping cloth member 27 arranged on the inner surface 26 of the first side wall 17 toward the piezoelectric vibrator 13, thus reducing the distance between the damping cloth member 27 and the piezoelectric vibrator 13, the sound characteristics produced by the piezoelectric acoustic device 2 may be substantially varied. Thus, arrangement of the cylinder 12 according to the present invention in such a manner so as to align a part 32 of a base 31 of the cylinder 12 with a part 35 of the first peripheral wall 18 is a highly significant advantage.

A waterproof or dust-proof air-permeable cloth member 36 is positioned between the end of the cylinder 12 that fits into the cylindrical fit section 4 and the wall of the housing 3 so as to cover the sound discharge hole 7. The cloth member 36 is made of a woven fabric material and formed into a thickness of 0.08 mm. The cloth member 36 is fixed onto a portion of an inner surface of the housing 3 surrounded by the cylindrical fit section 4 by means of double-sided tape (not shown). The cylinder 12 fits into the cylindrical fit section 4 and abuts against the waterproof or dust-proof cloth member 36 in such a manner so as to permit the passage 29 defined by the interior of the cylinder 12 to be connected to the sound discharge hole 7 in the exterior of the housing 3. The piezoelectric acoustic device 2 of the illustrated embodiment permits the first casing half 10 to be separated from the housing 3 by a distance corresponding to a length of the cylinder 12, so that the liquid crystal display component 6 and printed board 8 may be arranged in the gap between the housing 3 and the first side wall 17 of the first casing half 10.

The second casing half 11 comprises a second side wall 37 having a disc-like shape and a second peripheral wall 38 extending from near the outer peripheral portion of the second side wall 37 toward the first casing half 10 so as to leave the peripheral edge of the second side wall 37 exposed. The outside of the second peripheral wall 38 and the exposed edge of the second side wall 37 mate with the first peripheral wall 18 of the first casing half 10. The rear casing half 11 is integrally made of an insulating resin such as PPO resin containing glass as in the front casing half 10. Mating of the rear casing half 11 with the front casing half 10 creates a rear air chamber 39 that is defined as the gap or space between the rear casing half 11 and the piezoelectric vibrator 13. The second side wall 37 has a leakage hole 40 formed in a central portion thereof that acts as a rear air chamber opening.

In the illustrated embodiment, the two-part receiving casing 9 is formed by fitting the first peripheral wall 18 of the first casing half 10 and the second peripheral wall 38 of the second casing half 11 together. Such fitting between the first peripheral wall 18 of the first casing half 10 and the second peripheral wall 38 of the second casing half 11 forms a groove 41 of a substantially V-shape in cross section in the two-part receiving casing 9. The groove 41 functions to receive and hold a peripheral edge of the piezoelectric vibrator 13 therein.

Figure 5:
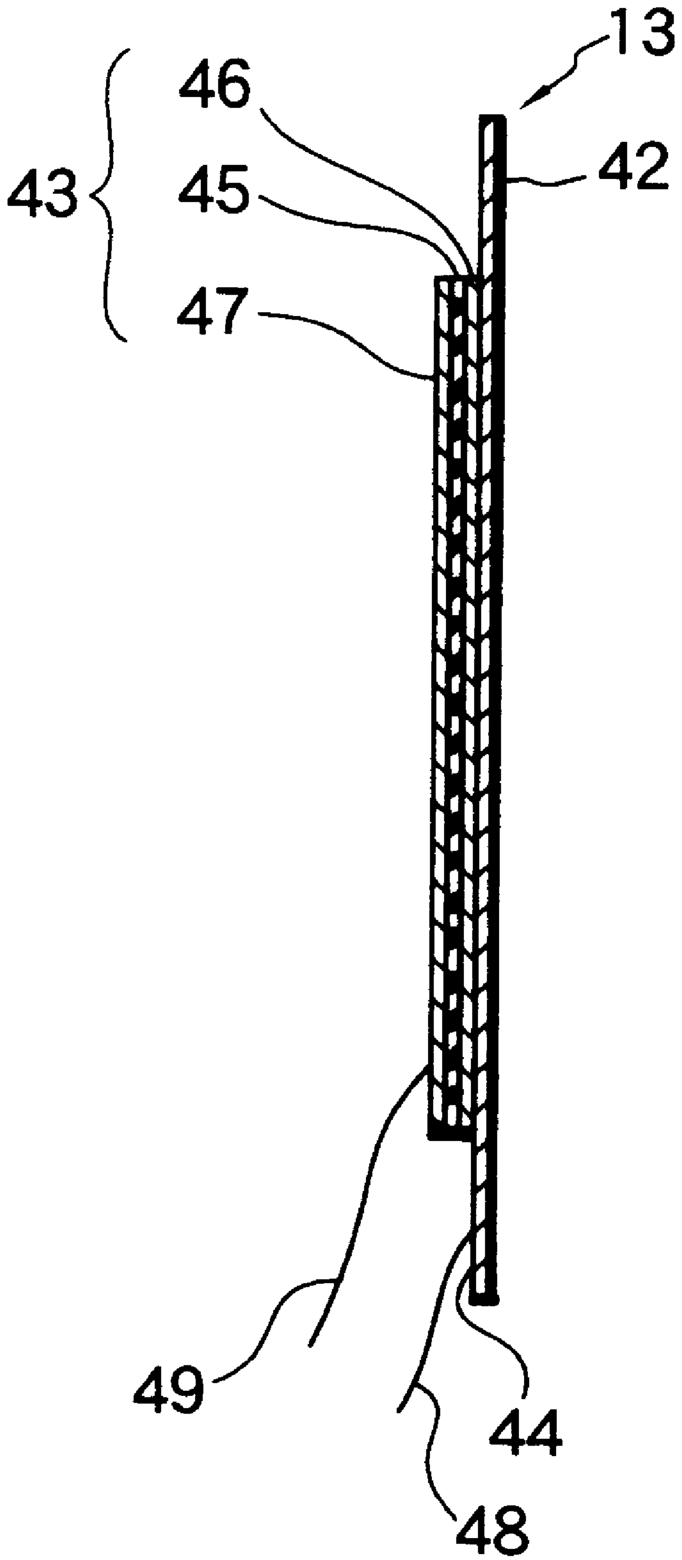
FIG. 5 is a schematic sectional view showing a piezoelectric vibrator incorporated in the piezoelectric acoustic device shown in FIG. 1.

The piezoelectric vibrator 13, as shown in FIG. 5, includes a disc-like vibrating plate 42 made of metal and a piezoelectric ceramic element 43 arranged on the vibrating plate 42 so as to leave an annular space on an outer peripheral portion 44 of the vibrating plate 42. The piezoelectric vibrator 13 is arranged in the two-part receiving casing 9 in such a manner that the piezoelectric ceramic element 43 is disposed facing the second side wall 37 of the rear casing half 11. In FIG. 5, the thickness of each of the elements of the piezoelectric acoustic device is emphasized for the sake of clarity. The peripheral edge of the piezoelectric vibrator 13 is fixed within the V-shaped groove 41 of the two-part receiving casing 9 by means of adhesive or pressure-sensitive adhesive. The vibrating plate 42 comprises a metal plate having a circular shape made of iron-nickel alloy. The piezoelectric ceramic element 43 comprises a piezoelectric ceramic 45, as well as a joint electrode layer 46 and a non-joint electrode layer 47, which are provided on opposite surfaces of the piezoelectric ceramic 45, respectively. The piezoelectric ceramic element 43 is joined onto the metal vibrating plate 42 so that the joint electrode layer 46 is electrically connected to the metal vibrating plate 42. The outer peripheral portion 44 of the metal vibrating plate 42 and the non-joint electrode layer 47 have lead wires 48 and 49 connected thereto by soldering, respectively. The lead wires 48 and 49 are led out of the two-part receiving casing 9 through the cutout 21. The piezoelectric vibrator 13 is adapted to vibrate depending on an electrical signal applied between the outer peripheral portion 44 of the metal vibrating plate 42 and the non-joint electrode layer 47.

In the illustrated embodiment, as described above, the annular reinforcing rib 33 is provided on the base 31 of the cylinder 12. Alternatively, the annular reinforcing rib 33 may be partially provided on the outer peripheral portion of the base 31 of the cylinder 12. It is a matter of course that arrangement of the reinforcing rib 33 may be eliminated.

As can be seen from the foregoing, the piezoelectric acoustic device of the present invention is so constructed that a part of the base of the cylinder and a part of the first peripheral wall of the first casing half of the two-part receiving casing are aligned with each other in a direction in which the cylinder extends. Such construction permits the cylinder to share a portion of the force or pressure which may be exerted on the cylinder in a direction toward the first side wall. This structure effectively prevents the first side wall from being excessively deflected toward the piezoelectric vibrator, thereby keeping the volume of the front air chamber from being substantially varied, which results in the elimination of sound variation in piezoelectric acoustic devices.

Also, in the piezoelectric acoustic device of the present invention, the opening through the first side wall is so arranged such that the center thereof is offset toward the center point of the first side wall rather than the central axis of the cylinder. Such arrangement of the opening permits an increase in length between the center of the opening and the outer peripheral portion of the inner surface of the first side wall. Thus, when the center of the damping cloth member is positioned in proximity to the center of the opening and an edge of the damping cloth member is positioned in proximity to the outer peripheral portion of the inner surface of the first side wall, the distance between the center of the damping cloth member and the edge thereof may be increased. This permits the damping cloth member to be increased in diameter, so that the solvent applied onto the damping cloth member may migrate in the damping cloth member while spreading toward the outer peripheral portion of the damping cloth member. This effectively prevents the dissolved synthetic resin from entering the opening through the first side wall, to thereby keep a porosity of a portion of the damping cloth member covering the opening from being substantially reduced, resulting in minimizing a variation in frequency characteristics of the piezoelectric acoustic device.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A piezoelectric acoustic device comprising:

a piezoelectric vibrator comprising a piezoelectric ceramic element joined to a metal vibrating plate;

a casing for receiving said piezoelectric vibrator;

said casing comprising a first casing half and a second casing half that when joined together define a space therebetween for receiving said piezoelectric vibrator, said first casing half comprising a first side wall disposed opposite said piezoelectric vibrator, said first side wall having an inner surface and an outer surface and a first peripheral wall extending from the periphery of said first side wall in a direction toward the junction with said second casing half;

said first side wall being spaced apart from said piezoelectric vibrator so as to form a front air chamber between said inner surface of said first side wall and said piezoelectric vibrator; and said first side wall having a cylinder integrally formed on said outer surface thereof extending perpendicular to the plane of said first side wall, said cylinder including a base defined as that portion of said cylinder that is disposed adjacent to said first side wall;

said cylinder having a diameter less than the diameter of said first side wall, said cylinder defining a passage that is connected to said front air chamber by an opening through said first side wall;

said cylinder being disposed toward an outer peripheral portion of said first side wall such that said base of said cylinder is rendered opposite at a part thereof to a part of said first peripheral wall.

2. A piezoelectric acoustic device as defined in claim 1, wherein said base of said cylinder is integrally provided on an outer peripheral portion thereof with a reinforcing rib;

said reinforcing rib having an inclined surface formed so as to extend downwardly from the outer periphery of said cylinder toward the outer surface of said first side wall.

3. A piezoelectric acoustic device as defined in claim 2, wherein said reinforcing rib is formed into an annular shape and arranged so that a part thereof is aligned with said first peripheral wall.

4. A piezoelectric acoustic device as defined in claim 1, wherein said first side wall has a damping cloth member joined to said inner surface thereof so as to cover said opening.

5. A piezoelectric acoustic device as defined in claim 4, wherein said opening is so arranged that a center thereof is offset toward a center point of said first side wall as opposed to being coincident with the central axis of the cylinder; and said first side wall is formed from a synthetic resin and said damping cloth member is joined to said inner surface of said first side wall by means of a solvent which does not dissolve said damping cloth member but dissolves said synthetic resin.

6. A piezoelectric acoustic device as defined in claim 5, wherein said damping cloth member is joined to said inner surface of said first side wall using a portion of said synthetic resin positioned around said opening.

7. A piezoelectric acoustic device comprising:

a piezoelectric vibrator comprising a metal vibrating plate and a piezoelectric ceramic element joined to said metal vibrating plate;

a two-part receiving casing comprising a first casing half and a second casing half formed from synthetic resin that when joined together define a space therebetween for receiving said piezoelectric vibrator;

said first casing half comprising a first side wall having an inner surface, an outer surface, and a first peripheral wall arranged so as to project in the direction of said second casing half from an outer edge portion of said first side wall;

said first side wall being disposed opposite to said piezoelectric vibrator and being spaced a predetermined distance from said piezoelectric vibrator so as to define a front air chamber between said inner surface of said first side wall and said piezoelectric vibrator;

said first side wall being formed with an opening; and a cylinder arranged so as to extend from said outer surface of said first side wall in a direction perpendicular to the plane of said first side wall, an interior portion of said cylinder defining a passage that is connected to said front air chamber through said opening, said opening being covered by an air permeable damping cloth member joined to the inner surface of said first side wall;

said cylinder including a base integrally provided on said outer surface of said first side wall;

said cylinder being disposed toward the outer periphery of said first side wall such that a part of said base is aligned with a part of said first peripheral wall.

8. A piezoelectric acoustic device as defined in claim 7, wherein said opening is so arranged that a center thereof is offset toward a center point of said first side wall and said opening is adjacent to an inner periphery of said cylinder; and said damping cloth member joined to said inner surface of said first side wall by means of a solvent that does not dissolve said damping cloth member but dissolves said synthetic resin of which said first side wall is made.

9. A piezoelectric acoustic device as defined in claim 8, wherein said damping cloth member is joined to said inner surface of said first side wall using a portion of said synthetic resin positioned around said opening.

10. A piezoelectric acoustic device as defined in claim 8, wherein said damping cloth member is of sufficient size so as to prevent said synthetic resin dissolved by said solvent from entering said opening.

11. A piezoelectric acoustic device as defined in claim 7, wherein said cylinder is formed into a circular shape in cross section, said opening is circular, and said damping cloth member is circular.

12. A piezoelectric acoustic device comprising:

a piezoelectric vibrator comprising a piezoelectric ceramic element;

a two-part receiving casing comprising a first casing half and a second casing half made of synthetic resin that when joined together define a space therebetween for receiving said piezoelectric vibrator;

said first casing half comprising a first side wall arranged opposite to said piezoelectric vibrator, said first side wall comprising an inner surface, an outer surface, and a first peripheral wall arranged so as to extend from an outer peripheral portion of said first side wall in the direction of said second casing half;

said second casing half comprising a second side wall arranged opposite to said piezoelectric vibrator and a second peripheral wall arranged so as to extend from near an outer peripheral portion of said second side wall for engaging with said first peripheral wall;

said first side wall being arranged so as to define a front air chamber between said inner surface of said first side wall and said piezoelectric vibrator;

said second side wall being arranged so as to define a rear air chamber between said second side wall and said piezoelectric vibrator; and a cylinder integrally formed with and arranged on said outer surface of said first side wall so as to extend generally perpendicular from the plane of said first side wall, said cylinder having a base and having an interior defining a passage;

said first side wall being formed with an opening, the center of which is offset toward a center point of said first side wall as opposed to being coincident with a central axis of said cylinder, said opening connecting said front air chamber and said passage;

said cylinder being offset toward an outer peripheral portion of said first side wall so that a part of said base of said cylinder and a part of said first peripheral wall are aligned with each other in a direction in which said cylinder extends.

13. A piezoelectric acoustic device as defined in claim 12, wherein said base of said cylinder is integrally provided on an outer peripheral portion thereof with a reinforcing rib;

said reinforcing rib having an inclined surface formed so as to extend downwardly from the outer periphery of said cylinder toward the outer surface of said first side wall.

14. A piezoelectric acoustic device as defined in claim 8, wherein said cylinder is formed into a circular shape in cross section, said opening is circular, and said damping cloth member is circular.

15. A piezoelectric acoustic device as defined in claim 9, wherein said cylinder is formed into a circular shape in cross section, said opening is circular, and said damping cloth member is circular.

* * * * *